(12) United States Patent
Dixit et al.

(10) Patent No.: US 7,009,861 B2
(45) Date of Patent: Mar. 7, 2006

(54) CONTENT ADDRESSABLE MEMORY CELL ARCHITECTURE

(75) Inventors: Kapil Dixit, Firozabad (IN); Hari B. Dubey, Dt-Ghazipur (IN)

(73) Assignee: STMicroelectronics Pvt. Ltd., (IN)

( * ) Notice: Subject to any disclaimer, the term of this patent is extended or adjusted under 35 U.S.C. 154(b) by 56 days.

(21) Appl. No.: 10/782,388

(22) Filed: Feb. 19, 2004

(65) Prior Publication Data

US 2005/0169028 A1 Aug. 4, 2005

(30) Foreign Application Priority Data

Feb. 20, 2003 (IN) ........................................ 158/03

(51) Int. Cl.
*G11C 15/00* (2006.01)
(52) U.S. Cl. ........................................ 365/49; 365/156
(58) Field of Classification Search .................. 365/49, 365/156
See application file for complete search history.

(56) References Cited

U.S. PATENT DOCUMENTS

| 5,446,685 | A | 8/1995 | Holst |
| 6,295,218 | B1 * | 9/2001 | Osada et al. .................. 365/49 |
| 6,888,732 | B1 * | 5/2005 | Hu .............................. 365/49 |

* cited by examiner

*Primary Examiner*—Michael Tran
(74) *Attorney, Agent, or Firm*—Jenkens & Gilchrist, P.C.

(57) ABSTRACT

A Content Addressable Memory (CAM) cell is presented which provides for improved speed and enhanced reliability. The CAM architecture enables maximal conduction of one of the output series pass transistors in the case of a data mismatch during a search operation thereby producing a minimal voltage drop, low impedance path for charging the bootstrap capacitance at the enabled output controlled switch, and causes one of the series pass transistors to conduct for discharging the bootstrap capacitance at the beginning of the precharge period of the bit lines.

20 Claims, 5 Drawing Sheets

CONTENT ADDRESSABLE MEMORY CELL ARCHITECTURE

PRIORITY CLAIM

The present application claims priority from Indian Application for Patent No. 158/Del/2003 filed Feb. 20, 2003, the disclosure of which is hereby incorporated by reference.

BACKGROUND OF THE INVENTION

1. Technical Field of the Invention

The present invention relates to an improved Content Addressable Memory (CAM) cell architecture.

2. Description of Related Art

Content Addressable Memory (CAM) gets its name from the fact that a data word is selected or identified by its contents rather than by its physical address. In other words, a CAM is a memory that can be instructed to compare a specific pattern of comparand or reference data with data stored in the CAM array. The entire CAM array is searched in parallel for a match with the comparand data. CAMs are used in a variety of applications, such as sorting large databases, pattern-matching for image processing and voice recognition and cache systems of high speed computing systems. CAM cells are becoming increasingly popular in high-speed network routers and many other applications known in the art of computing.

A standard content addressable memory comprises an array of individual CAM cells. Each CAM cell consists of a data storage unit and comparison circuitry. A CAM cell can store a single bit of data and can compare the stored bit with a comparand or reference bit during a search operation.

In a common implementation, each row represents a different word of maximum length equal to the total number of columns in the CAM array. During the comparison operation, if all the reference bits match the corresponding stored data bits, a match is deemed to be achieved otherwise the match operation is failed. An indicator, commonly known as a Match Line (ML), associated with each stored word indicates a match or mismatch, which can be detected by a sense amplifier or any other sensing means connected to each ML.

To compare and combine the results of multiple cells of a row several approaches are used one of which is a NAND configuration, wherein the ML driver devices (pass transistors) of all the cells belonging to a word are connected in series. This NAND configuration consumes less power but is inherently slower than desired for CAMs used in modern deep-sub micron processes where supply voltage is continually decreasing.

In another common implementation, a NOR configuration is used for high-speed CAMs, wherein the ML driver devices (pass transistors) of all the cells belonging to a word are connected in parallel to pull down an initially precharged (at logical "High") ML during the SEARCH operation. With this NOR configuration, a match for a word occurs whenever no cell of the row drives ML "low". This NOR configuration is faster than a NAND configuration but consumes considerably larger power.

Throughout this disclosure, logical "1" refers to and is interchangeable with a logical "High" corresponding to a voltage $V_{DD}$, while logical "0" refers to and is interchangeable with a logical "Low" corresponding to GND. FIG. 1 illustrates a prior art 9-transistor CAM cell 100 with NOR configuration. The CAM cell 100 includes an SRAM cell for data storage, comprising a pair of cross-coupled inverters formed by transistors 111, 112, 113 and 114 and a pair of access transistors 115 and 116. The comparison circuitry of the CAM cell 100 comprises a pair of pass transistors 117 and 118. The conducting terminals of the pass transistor 113 and 111 are connected in series between the supply voltage $V_{DD}$ and ground GND while the control terminals are connected to the common conducting terminals F of the pass transistors 114 and 112. The conducting terminals of the pass transistor 114 and 112 are also connected in series between $V_{DD}$ and GND while the control terminals are connected to the common conducting terminals T of the pass transistors 113 and 111. The conducting terminals of pass transistors 115 and 116 connect nodes T and F to the corresponding bit lines BLT and BLF while the control terminals are connected to word line WL. The pass transistors 117 and 118 are connected in series between bit lines BLT and BLF and the common node is labeled as the Bit-Match node. The control terminals of transistors 117 and 118 are coupled to nodes F and T, respectively. Pass transistor 119 is coupled between ML and ground GND and its control terminal is connected to the Bit-Match node of the CAM cell.

The READ and WRITE operations of this CAM cell 100 are the same as those of a standard 6-transistor SRAM cell, wherein the precharge state of bit lines BLT and BLF is logical "High". During the SEARCH operation, bit lines BLT and BLF are initially precharged to logical "Low" and ML is precharged to logical "High". Then the comparand bit is placed on BLT and its complement is placed on BLF. If the comparand bit matches with the data bit stored in the CAM cell, then one of the pass transistors 117 or 118 drives the Bit-Match node to logical "0" and therefore ML remains at logical "High", indicating a match. On the other hand, if there is a mismatch between the applied comparand bit and the data bit stored in the CAM cell, then one of the pass transistors 117 or 118 drives the Bit-Match node to "$V_{DD}-V_{tn}$", thereby turning the pull-down transistor 119 on and pulling down ML indicating a mismatch.

The CAM cell 100 requires a precharge to logical "Low" operation for bit lines and a precharge to logical "High" operation for ML when a SEARCH operation is requested if the default standby state is for a READ or a WRITE operation. Conversely, if the CAM cell 100 is ready for a SEARCH operation in its default standby state, then the bit lines must be precharged to logical "High" and ML is thereby discharged when a READ or WRITE operation is requested. It is known that both bit lines and ML impose a heavy capacitive load on their drivers and prechargers. Therefore, CAM cell 100 consumes more power and provides larger READ/WRITE/SEARCH access times.

FIG. 2 illustrates another prior art 9-transistor CAM cell 200 using a NOR configuration, wherein the only difference between the CAM cell 100 and 200 is that the CAM cell 200 is provided with dedicated lines CBLT and CBLF for the search operation as shown in the figure. Thus, CAM cell 200 provides more flexibility in the timing of READ, WRITE and SEARCH operations but at the cost of hardware overhead required for controlling the dedicated compare bit lines CBLT and CBLF.

FIG. 3 illustrates another prior art 9-transistor CAM cell 300 with NOR configuration in accordance with U.S. Pat. No. 5,446,685 using pulsed ground technique to reduce the power consumption in comparison to conventional NOR configured CAM cells. The pull-down device to drive the ML to a logical "Low" during a mismatch is a pass transistor 319. The pass transistor 319 is connected between ML and a Search Enable Line and its gate is connected to the Bit-Match node. The Search Enable Line pulsed to ground only during the SEARCH operation. The CAM cell 300 has a single standby state for READ, WRITE and SEARCH operations, leading to higher speed operations by eliminating precharge operations at the start of the cycles and to lower power consumption because there is no standby state change between READ/WRITE and. SEARCH operations.

There are however, a number of disadvantages associated with CAM cell 300. These disadvantages can be explained by describing the SEARCH access cycle. Suppose a CAM cell stores a logical "0", that is, node T is at logical "0" and node F is at logical "1". In the standby state, bit lines BLT and BLF, Search Enable Line and ML will be precharged to logical "1". Since the control terminal of the pass transistor 317 is connected to node F, which is at logical "1", therefore the transistor 317 will be ON and will drive the Bit-Match node to voltage "$V_{DD}-V_{tn}$". On the other hand, the pass transistor 318 will be OFF as its gate is connected to node T that is at logical "0". When a SEARCH is requested, the comparand bit and its complementary bit are placed on bit lines BLT and BLF respectively. Simultaneously, the Search Enable Line is provided a pulsed ground. Now, due to bootstrapping, the gate-to-source capacitance ($C_{gs}$) of the pull-down transistor 319 tends to decrease the voltage at Bit-Match node as the Search Enable Line rapidly switches from logical "High" to logical "Low". Consequently one of the following two cases can occur:

In the first case, the comparand bit matches the stored data bit, that is BLT and node T are at the same logic state and similarly, BLF and node F are at the complement of the logical state. One of the pass transistors 317 or 318 (317 in this case as node F is at logical "1") drives the Bit-Match node to full logical "0" and therefore ML remains at logical "High" indicating that a match has been detected.

In the second case, there is a mismatch between the comparand bit and stored data bit, that is BLT and node T are at opposing logical values. One of the transistors 317 or 318 (317 in this case as node F is at logical "1") drives the Bit-Match node to "$V_{DD}-V_{tn}$", thereby turning ON the pass transistor 319. Thus, pass transistor 319 begins to pull-down the ML, indicating a mismatch. In the mismatch condition, the Bit-Match node initially observes a downward spike due to bootstrapping, described above, before settling at "$V_{DD}-V_{tn}$" as it is being driven by one of the pass transistors 317 or 318. Thus, in the mismatch condition, the voltage at the Bit-Match node remains essentially less than "$V_{DD}-V_{tn}$" and hence, discharging of ML through the pass transistor 319 is slower than what is expected if the Bit-Match node were at $V_{DD}$. Since the search access time in a NOR-configured CAM cell is mainly determined by the discharge of ML (No discharge of ML in match condition, which is same as the precharge state of ML), therefore search access time is large in this type of implementation. Moreover, as the supply voltages being utilized are decreasing in current designs, a slight change in voltage can significantly affect the performance of a device.

As soon as the SEARCH operation is over, bit lines BLT and BLF, Search Enable Line and ML return to the respective standby states (logical "High" for all). As the Search Enable Line rapidly switches from logical "Low" to logical "High", it causes the bootstrapping to occur again at Bit-Match node, this time in the opposite direction. This results in two cases:

In the first case, if there was a match during the SEARCH operation, then the voltage at Bit-Match node is "0", after the SEARCH operation rises only up to its standby state value of "$V_{DD}-V_{tn}$".

In the second case, if there was a mismatch during the SEARCH operation, the voltage at the Bit-Match node would be "$V_{DD}-V_{tn}$". Furthermore, this voltage "$V_{DD}-V_{tn}$" rises beyond $V_{DD}$ due to the bootstrapping after the SEARCH operation. In fact, the voltage at Bit-Match node reaches a value of "$(2V_{DD})-V_{tn}$" and remains at this value until the next SEARCH cycle starts because both the pass transistors 317 and 318 become OFF. Thus, until the next SEARCH cycle starts, the pass transistor 317 has terminal voltages "$V_{DD}$" and "$(2V_{DD})-V_{tn}$" with the gate at "$V_{DD}$" (voltage at node F) and similarly the pass transistor 318 has terminal voltages "$V_{DD}$" and "$(2V_{DD})-V_{tn}$" with the gate at "0" (voltage at node T). Thus, the drain-to-gate voltage of the pass transistor 318 is at "$(2V_{DD})-V_{tn}$" and the voltage across the reverse biased drain-to-substrate diode is at "$(2V_{DD})-V_{tn}$", which could degrade the device. A similar situation occurs with the pass transistor 317 in a cell in which node T is at logical "1" and node F is at logical "0" and a mismatch occurs in that cell. This logical "High" voltage (which is greater than a normal full logical "High") at the gate of the pull-down transistor 319 degrades the gate-oxide. If the mismatch spreads over several SEARCH cycles, which normally happens in CAM arrays, the bootstrapping becomes a severe problem.

The bootstrapping that occurs within each CAM cell at the Bit-Match node slows the discharging of ML and hence reduces the speed of SEARCH operation and also results in higher than normal degradation rates of the transistors involved. The above problems with the bootstrapping become increasingly significant in sub-micron technologies.

These limitations highlight the need for a CAM cell implementation that offers faster SEARCH operation at lower power consumption and improves reliability.

SUMMARY OF THE INVENTION

There is a need in the art for a CAM cell with improved performance, lower power consumption and increased device reliability.

There is further a need in the art for a CAM cell capable of working with designs in which the supply voltage levels and fabrication process sizes are decreasing.

There is also a need in the art to provide a CAM cell implementation that eliminates bootstrapping at the Bit-Match node of the CAM cell and thereby avoids possible degradation of devices involved and improves device reliability.

The present invention addresses the foregoing and other needs by providing a Content Addressable Memory (CAM) cell with improved speed and enhanced reliability. The cell comprises:

a data latch with complementary data terminals, a pair of complementary data lines that provide data connectivity with the data latch during read, write and search operations, a pair of input controlled switches that selectively couple the data latch terminals to the complementary data lines during read or write operations, a pair of output series pass transistors, each having its control terminal connected to a separate terminal of the data latch, one of its main terminals connected to a separate bit line, and the second main terminal connected to the corresponding terminal of the other series pass transistor, a Match Output signal line that identifies a match/no-match at the end of a Search operation, an output controlled switch having its control terminal connected to the common main terminal of the series pass transistors, while one of its main terminals drives the Match Output signal line to provide the result of the search operation, and a Search Enable signal line that enables the output controlled switch only during the search operation.

During the search operation neither of the output series pass transistors conducts if the complementary bit line data matches the data latch outputs, one of the output series pass transistors conducts maximally providing a minimal voltage drop and a low impedance charging path for the bootstrap capacitance at the enabled output controlled switch when the complementary bit line data does not match the latch data, and one of the series pass transistors conducts to discharge the bootstrap capacitance at the beginning of the precharge period of the complementary bit lines.

The output series pass transistors are P-channel MOS transistors with a relatively low threshold voltage, and the output controlled switch is an n-channel MOS transistor with a relatively high threshold voltage, and the complementary bit lines are precharged to a "high" level.

An embodiment of the present invention also provides a method for providing a Content Addressable Memory (CAM) cell offering improved speed and enhanced reliability. The method includes:

providing a data latch with complementary data terminals, supplying a pair of complementary data lines that provide data connectivity with the data latch during read, write and search operations, selectively coupling the data latch terminals to the complementary data lines during read or write operations, connecting the control terminal of each of a pair of output series pass transistors to a separate terminal of the data latch, one of its main terminals to a separate bit line, and the second main terminal to the corresponding terminal of the other series pass transistor, providing a Match Output signal line that identifies a match/no-match at the end of a Search operation, connecting the control terminal of an output controlled switch to the common main terminal of the series pass transistors, while one of its main terminals drives the Match Output signal line to provide the result of the search operation, and supplying a Search Enable signal line that enables the output controlled switch only during the search operation.

During the search operation neither of the output series pass transistors conducts if the complementary bit line data matches the data latch outputs, one of the output series pass transistors conducts maximally providing a minimal voltage drop and a low impedance charging path for the bootstrap capacitance at the enabled output controlled switch when the complementary bit line data does not match the latch data, and one of the series pass transistors conducts to discharge the bootstrap capacitance at the beginning of the precharge period of the complementary bit lines.

Another embodiment of the present invention comprises a Content Addressable Memory (CAM) cell which includes a data latch circuit including true and false terminals, and a comparison circuit. The comparison circuit comprises first and second p-channel transistors connected in series at a bit match node, a first of the p-channel transistors having its gate connected to the true terminal of the data latch circuit and a second of the p-channel transistors having its gate connected to the false terminal of the data latch circuit.

Yet another embodiment of the present invention comprises a Content Addressable Memory (CAM) cell which includes a data latch circuit including true and false terminals, and a comparison circuit. The comparison circuit comprises first and second transistors connected in series at a bit match node, the transistor having its gate connected to the true terminal of the data latch circuit and the second transistor having its gate connected to the false terminal of the data latch circuit, and a match line transistor having conduction terminals coupled between a match line and a reference line and a gate terminal coupled to the bit match node. The first and second transistors have a first $V_t$ value and the match line transistor has a second $V_t$ value, the second $V_t$ value being higher than the first $V_t$ value.

BRIEF DESCRIPTION OF THE DRAWINGS

A more complete understanding of the method and apparatus of the present invention may be acquired by reference to the following Detailed Description when taken in conjunction with the accompanying Drawings wherein.

DETAILED DESCRIPTION OF THE DRAWINGS

Figure 4:
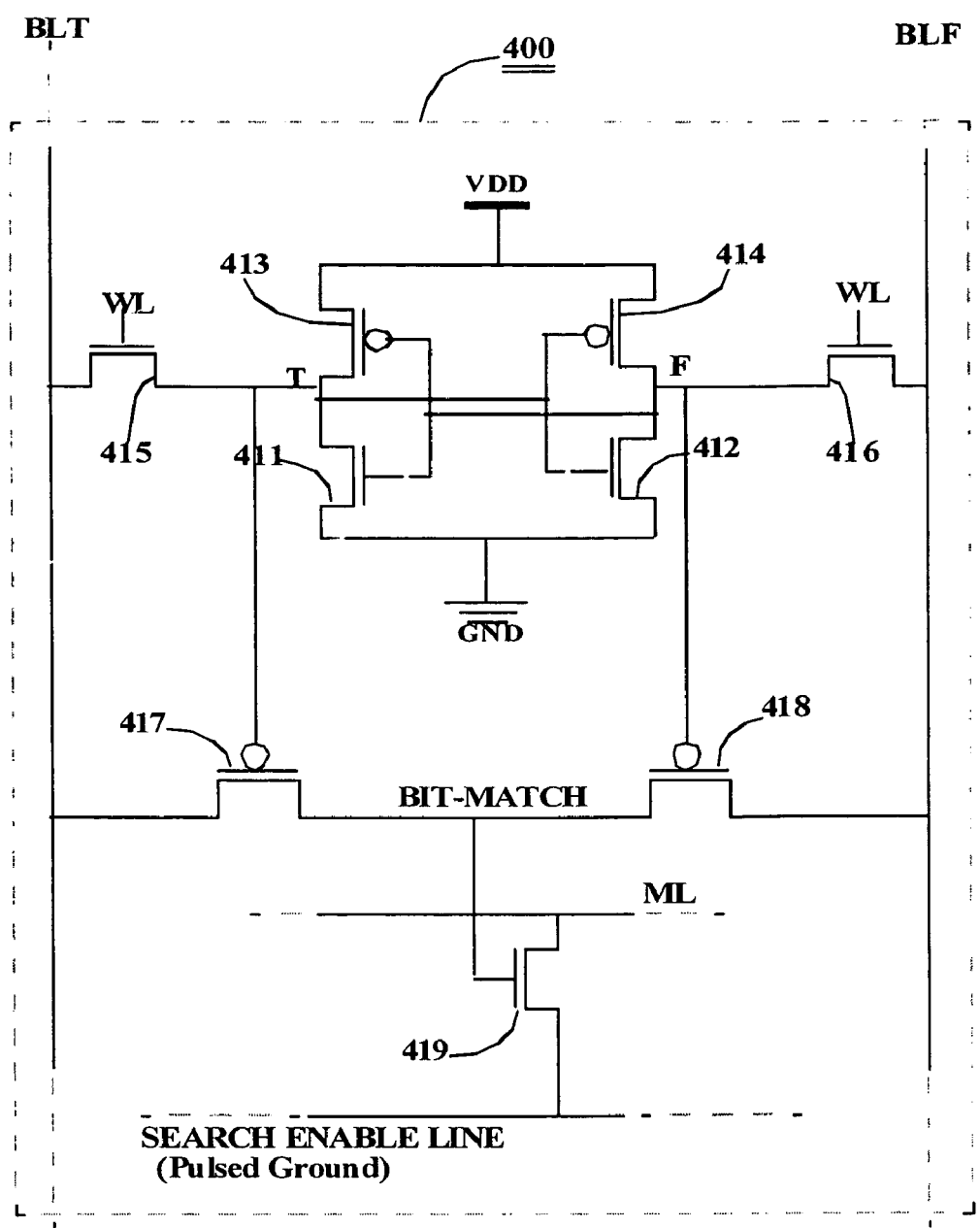
FIG. 4 shows the schematic diagram of the 9-transistor CAM cell in accordance with a first embodiment of the instant invention.

FIG. 4 shows a CAM cell 400 according to an embodiment of the present invention. The CAM cell 400 includes an SRAM cell for data storage, comprising a pair of cross-coupled inverters formed by the pass transistors 411, 412, 413 and 414 and a pair of access transistors 415 and 416. The comparison circuitry of the CAM cell 400 comprises a pair of pass transistors 417 and 418.

The conducting terminals of the pass transistors 413 and 411 are connected in series between supply voltage $V_{DD}$ and ground GND while the control terminals are connected to the common conducting terminal F of the pass transistors 414 and 412. Further, the conducting terminals of the pass transistors 414 and 412 are connected in series between supply voltage $V_{DD}$ and ground GND while the control terminals are connected to the common conducting terminal T of the transistors 413 and 411. The pass transistors 415 and 416 connect respective nodes T and F to respective bit lines BLT and BLF and word line WL connects the control terminals of pass transistors 415 and 416. The conducting terminals of the pass transistors 417 and 418 are connected in series between bit lines BLT and BLF while the common node is labeled as Bit-Match node. The control terminals of the pass transistors 417 and 418 are coupled to nodes T and F, respectively. The pull-down transistor 419 is coupled between ML and a Search Enable Line while its control terminal is connected to Bit-Match node of the CAM cell. The Search Enable Line is provided a pulsed ground only during the SEARCH operation.

The READ and WRITE operations of the CAM cell 400 of the invention are exactly similar to those of a standard 6-transistor SRAM cell. The SEARCH operation of the CAM cell 400 of the invention is described in detail below:

Assume a CAM cell is in logical "0" state, that is node T is at logical "0" and node F is at logical "1". In the standby state, both bit lines BLT and BLF, Search Enable Line and ML are precharged to logical "1". Since the control terminal of the pass transistor 417 is connected to node T, which is at logical "0", transistors 417 is ON and drives the Bit-Match node to $V_{DD}$, that is, to full logical "High". On the other hand, pass transistor 418 is OFF as its control terminal, connected to node F, is at logical "1". When the SEARCH is requested, the comparand bit and its complementary bit are placed on bit lines BLT and BLF, respectively. Search Enable Line is provided a pulsed ground. The bootstrapping effect of the gate-to-source capacitance ($C_{gs}$) of the pull-down transistor 419 tends to decrease the voltage at Bit-Match node as the Search Enable Line rapidly switches from logical "High" to logical "Low". This behavior results in two possible scenarios:

The first scenario arises when there is a mismatch between the comparand bit and stored data bit. In this case, BLT and node F are at the same logic state and BLF and node T are at the complement of that logic state. One of the transistors 417 or 418 (417 in this case as node T is at logical "0") drives the Bit-Match node to $V_{DD}$, i.e., to full logical "High", thereby turning 'On' the pass transistor 419. Thus, pass transistor 419 begins to pull-down the ML, indicating a mismatch. Since the P-channel pass transistor passes a logical "High" at a higher speed, therefore bootstrapping at the Bit-Match node, in the mismatch condition, is now less significant than in prior art CAM cell 300. Thus, in the mismatch condition, the voltage at the Bit-Match node is "$V_{DD}$", thereby turning the pass transistor 419 fully ON. As a result, the discharging of ML through the pass transistor 419 is faster than prior art CAM cell 300. Therefore, the search access time in this type of cell implementation is shorter than that in prior art CAM cell 300, because the search access time in CAM cell is mainly determined by the discharge of ML (no discharge of ML in match condition, which is same as the precharge state of ML).

In the second scenario the comparand bit matches the stored data bit, that is BLT and node T are at the same logic state and similarly BLF and node F are at the complement of that same logical state. In this condition one of pass transistors 417 or 418 (417 in this case as node T is at logical "0") pulls the Bit-Match node down to logical "0". In fact, in the match condition the voltage at the Bit-Match node is never at full logical "0" since the P-channel pass transistor cannot pass a full logical "0" but instead passes "$V_{tp}$" and bootstrapping effect at the Bit-Match node decreases the voltage below "$V_{tp}$" as the Search Enable Line rapidly switches from logical "High" to logical "Low" when a SEARCH is requested. This bootstrapping is sufficient to keep the pull-down transistor 419 turned OFF and therefore maintain ML at logical "High" indicating a match.

Though the voltage at the Bit-Match node reduces due to bootstrapping, it can still be high enough to slightly turn-on the pull-down transistor 419, especially in designs where sub-threshold leakage currents are high. The worst case occurs when the data word stored in the CAM array perfectly matches the comparand word being searched. In such a case, all the pull-down transistors 419 of each and every CAM cell belonging to that word are slightly ON and may pull the ML sufficiently down to be detected by a high-speed match sense amplifier thereby, resulting in a wrong mismatch. This problem can be solved by making the threshold voltage "$V_{tn}$" of the pull-down transistor larger than threshold voltage "$V_{tp}$" of the transistors 417 and 418.

Figure 5:
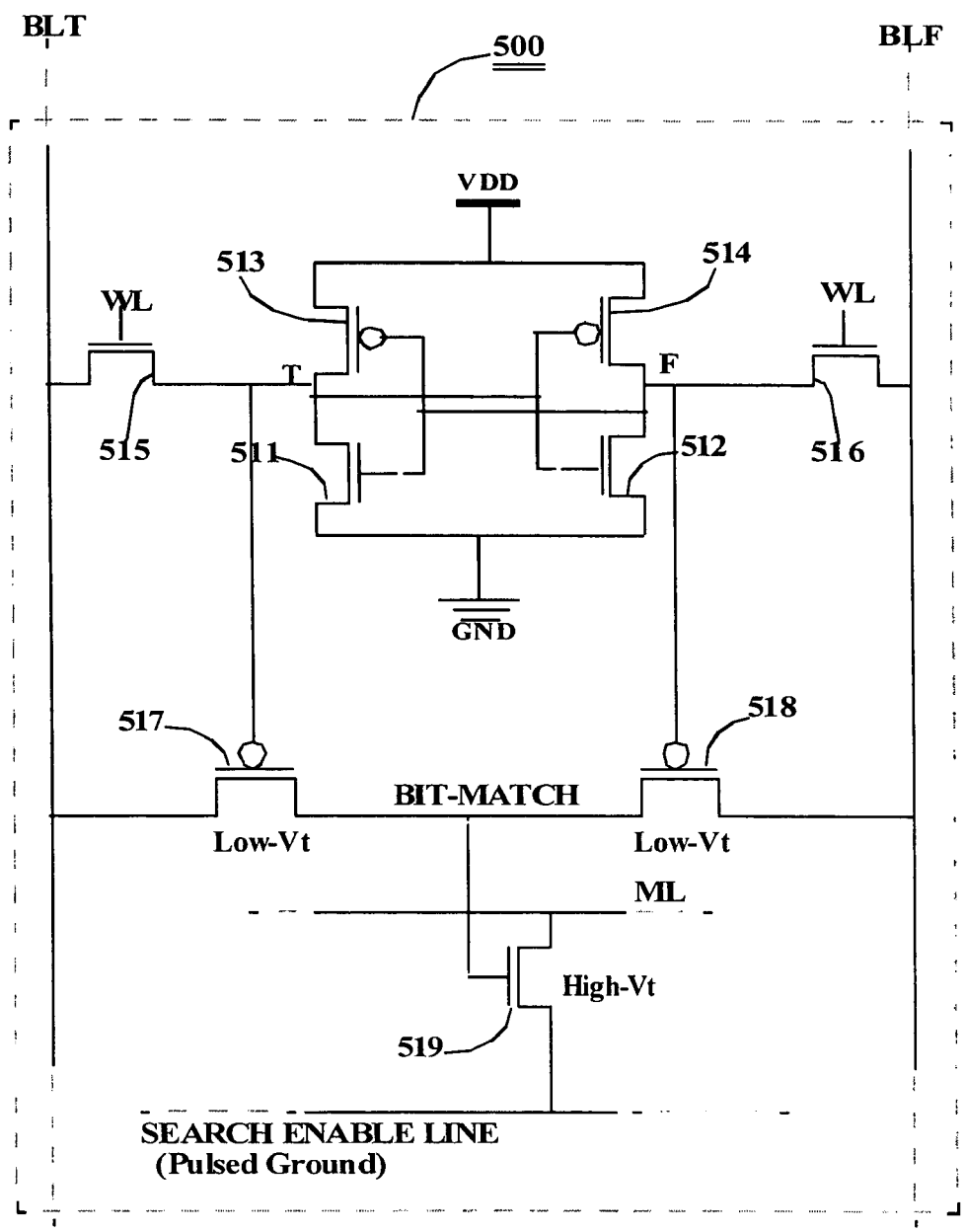
FIG. 5 shows the schematic diagram of the 9-transistor CAM cell in accordance with a second embodiment of the present invention.

This goal can be achieved by designing the pull-down transistor 419 with a large channel length. But this has a two-fold effect on the CAM cell, i.e., the area and the SEARCH access time will be large. On the other hand, a more advantageous solution is to use a dual-$V_t$ process as illustrated in the second embodiment of the present invention in CAM cell 500 of FIG. 5. The CAM cell 500 of FIG. 5 includes a SRAM cell for data storage, exactly the same as the CAM cell 400 of FIG. 4, comprising a pair of cross-coupled inverters formed by transistors 511, 512, 513 and 514 and a pair of access transistors 515 and 516. But the comparison circuitry of the CAM cell 500 is slightly different from that of the CAM cell 400. The P-channel transistors 517 and 518 of the comparison circuitry have a low-$V_{tp}$ and the N-channel pull-down transistor 519 has a high-$V_{tn}$ to prevent the discharging of ML in match condition.

Figure 1:
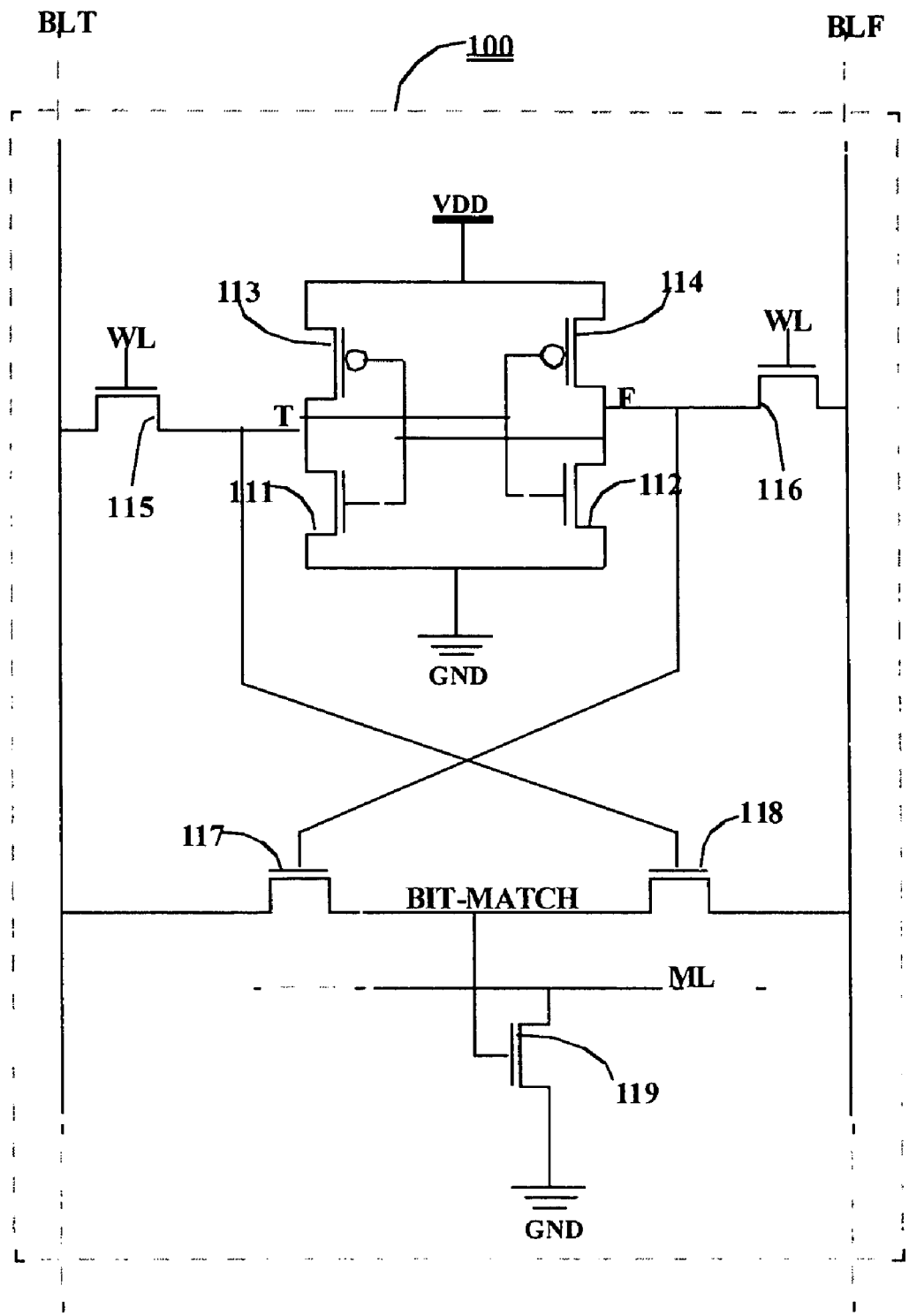
FIG. 1, previously described, shows the schematic diagram of a conventional 9-transistor CAM cell.
Figure 2:
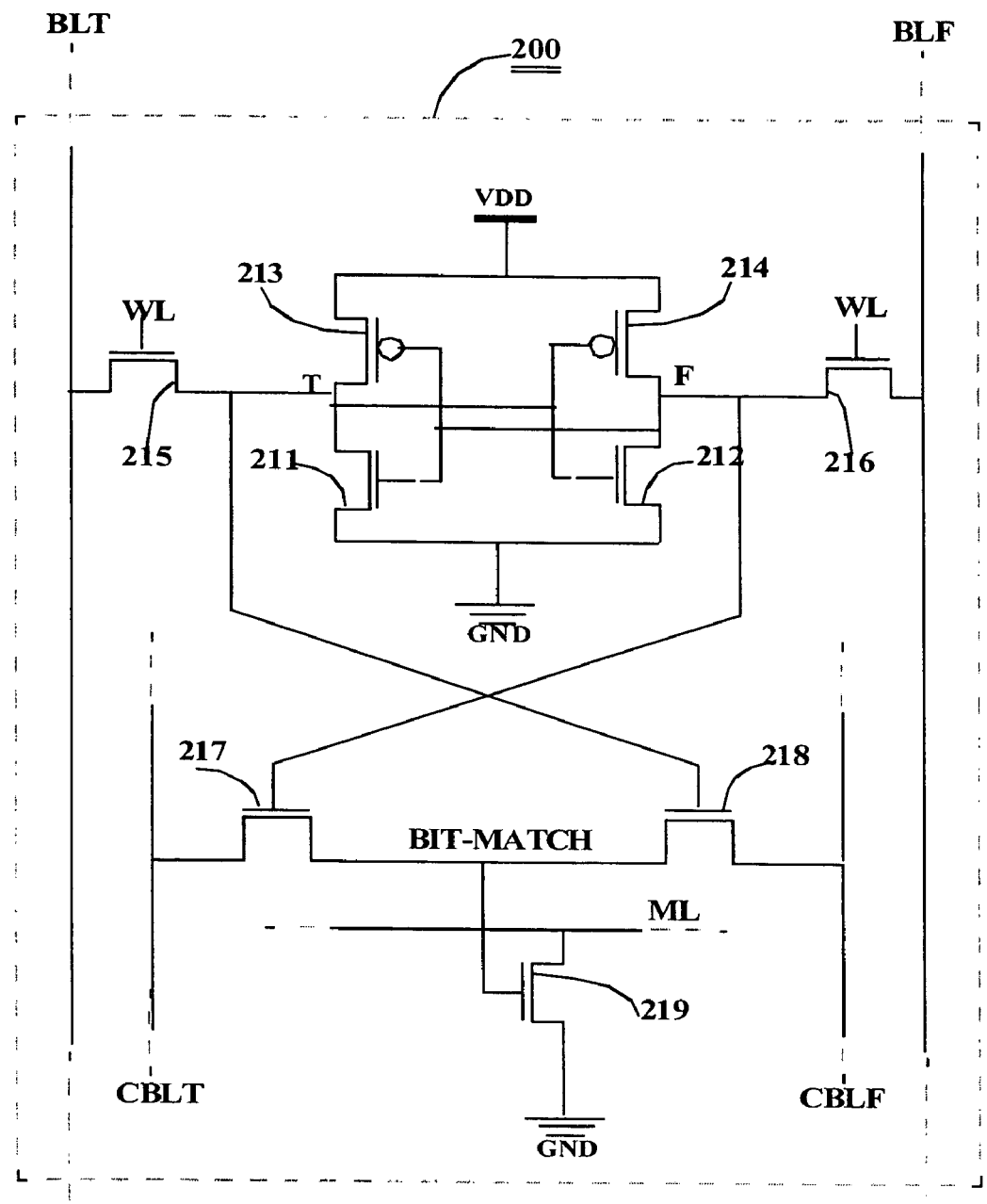
FIG. 2, previously described, shows the schematic diagram of another conventional 9-transistor CAM cell having dedicated compare data lines shows a schematic circuit diagram of the LDO linear voltage regulator with improved current limiting in accordance with an embodiment of the present invention.
Figure 3:
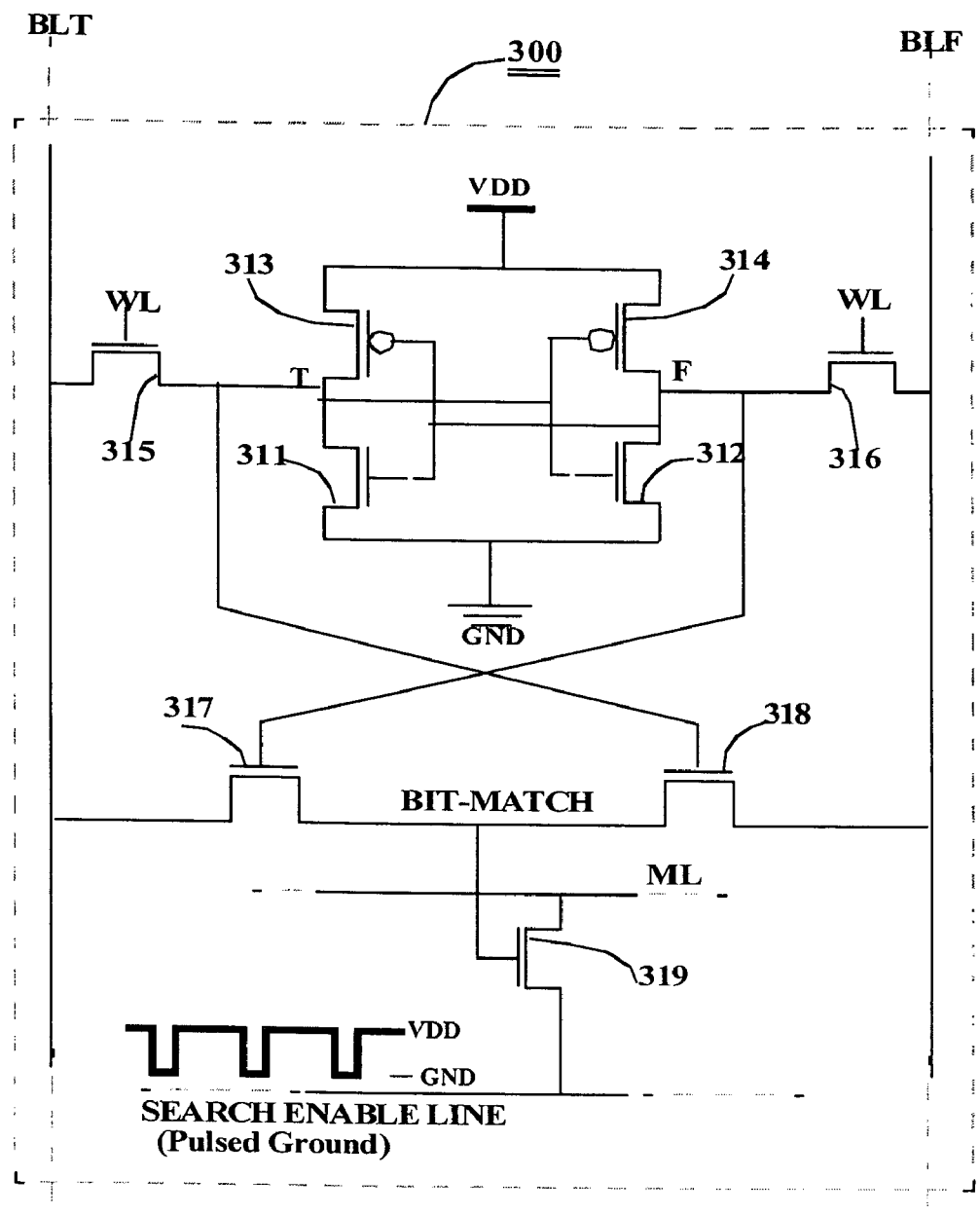
FIG. 3, previously described, shows the schematic diagram of yet another conventional 9-transistor CAM cell using pulsed ground technique for SEARCH operation.

A further advantage of using P-channel transistors 517 and 518 with low-$V_{tp}$ is that they can now pass a full logical "High" at a higher speed at the Bit-Match node in the mismatch condition. This increase in speed further allows for decreasing the width of the P-channel transistors 517 and 518 as compared to the equivalent transistors 317 and 318 of prior art CAM cell 300 of FIG. 3. Any decrease in the width of these P-channel transistors 517 and 518 reduces the capacitive load on the bit lines and hence, increases the number of CAM cells that can be coupled to each bit line.

As soon as the SEARCH operation is over, both the bit lines BLT and BLF, Search Enable Line and ML return to their respective standby states (logical "High" for all). Subsequently, bootstrapping occurs again at the Bit-Match node but this time in the opposite direction because the Search Enable Line rapidly switches from logical "Low" to logical "High". The following two cases can occur after this:

When a match is detected during the SEARCH operation, the voltage at the Bit-Match node becomes "0" and, after the SEARCH operation, it rises to its standby state value of $V_{DD}$. Therefore, no problem is encountered in this case.

One of the advantages of the CAM array because the number of mismatches is typically much larger than the number of matches, then the voltage at the Bit-Match node would be $V_{DD}$. After the SEARCH operation is over, voltage $V_{DD}$ tends to rise beyond $V_{DD}$ due to the bootstrapping. In fact, the voltage at Bit-Match node cannot increase beyond $V_{DD}$ because one of the P-channel transistors 417 or 418 (417 in this case as node T is at logical "0") always remains ON and hence Bit-Match node never becomes floating. As a result, any possibility of bootstrapping is eliminated at this node. Furthermore, even if the size of the P-channel transistor 417 is too small for removing the increased voltage at the Bit-Match node, then also the voltage at the Bit-Match node cannot rise beyond "$V_{DD}+V_{tp}$". This happens because the voltage "$V_{DD}+V_{tp}$" at Bit-Match node will also turn ON the other P-channel transistor 418, which in turn helps the P-channel transistor 417 in removing the increased voltage at the Bit-Match node. Thus, the voltage at Bit-Match node will remain at $V_{DD}$, after a mismatch, as the Search Enable Line rapidly switches from logical "Low" to logical "High" as soon as the SEARCH operation is over. Therefore, the possibility of device degradation due to bootstrapping is completely eliminated thereby, increasing reliability.

The CAM cells 400 and 500 of the present invention offer many advantages over the prior art CAM cell 300. One key advantage concerns the use of P-channel transistors in the comparison circuitry to provide a full logical "High" at a higher speed at the Bit-Match node in the mismatch condition of SEARCH operation, thereby, turning the pull-down transistor fully ON for providing high performance. A further advantage is in elimination of bootstrapping at the Bit-Match node as soon as the SEARCH operation is over, thereby eliminating the possibility of device degradation due to bootstrapping. The second embodiment of the present invention with dual-$V_t$ process, where P-channel transistors with low-$V_{tp}$ are used in the comparison circuitry, allows an increase in the number of CAM cells that can be coupled to each bit line.

One of the advantages of the CAM cell of the present invention over the prior art CAM cell is its layout. The conventional CAM cell 300 of prior art has an imbalance between the number of transistor types, leading to a non-optimized layout of the CAM cell. Out of the total of 9 transistors, only 2 are P-channel transistors. All the N-channel transistors of a cell need to be placed in a common P-well. The result is an unbalanced layout with regions containing N-channel transistors being highly congested while area is wasted around the remaining 2 P-channel transistors. It is well known in the industry that n+ to p+ spacing is usually kept large relative to other design rules in a typical CMOS fabrication process. Also, this n+ to p+ space can not contain any transistors. This requires the aspect ratio of the cell to be made narrow, that is the smaller dimension of a typical cell is in the direction of the line of the P-well separating N-channel transistors and P-channel transistors. This arrangement minimizes the area wasted in n+ to p+ spacing. However, it is difficult to achieve this layout if there is an imbalance between the number of N-channel transistors and P-channel transistors. On the other hand, the CAM cell of the present invention is more balanced in terms of the number of transistor types, i.e.; 4 P-channel transistors and 5 N-channel transistors (as opposed to 2 P-channel & 7N-channel transistors of prior art), thereby leading to an area-efficient layout of the CAM cell.

Although preferred embodiments of the method and apparatus of the present invention have been illustrated in the accompanying Drawings and described in the foregoing Detailed Description, it will be understood that the invention is not limited to the embodiments disclosed, but is capable of numerous rearrangements, modifications and substitutions without departing from the spirit of the invention as set forth and defined by the following claims.

What is claimed is:

1. A Content Addressable Memory (CAM) cell providing improved speed and enhanced reliability, comprising:
   a data latch with complementary data terminals,
   a pair of complementary data lines that provide data connectivity with the data latch during read, write and search operations,
   a pair of input controlled switches that selectively couple the data latch terminals to the complementary data lines during read or write operations,
   a pair of output series pass transistors, each having its control terminal connected to a separate terminal of the data latch, one of its main terminals connected to a separate bit line, and the second main terminal connected to the corresponding terminal of the other series pass transistor,
   a Match Output signal line that identifies a match/no-match at the end of a Search operation,
   an output controlled switch having its control terminal connected to the common main terminal of the series pass transistors, while one of its main terminals drives the Match Output signal line to provide the result of the search operation, and
   a Search Enable signal line that enables the output controlled switch only during the search operation,
   the arrangement being such that during the search operation neither of the output series pass transistors conducts if the complementary bit line data matches the data latch outputs, one of the output series pass transistors conducts maximally providing a minimal voltage drop and a low impedance charging path for the bootstrap capacitance at the enabled output controlled switch when the complementary bit line data does not match the latch data, and one of the series pass transistors conducts to discharge the bootstrap capacitance at the beginning of the precharge period of the complementary bit lines.

2. A CAM cell as claimed in claim 1, wherein the output series pass transistors are P-channel MOS transistors with a relatively low threshold voltage, and the output controlled switch is an n-channel MOS transistor with a relatively high threshold voltage, and the complementary bit lines are precharged to a "high" level.

3. A method for providing a Content Addressable Memory (CAM) cell offering improved speed and enhanced reliability, comprising the steps of:
   providing a data latch with complementary data terminals,
   supplying a pair of complementary data lines that provide data connectivity with the data latch during read, write and search operations,
   selectively coupling the data latch terminals to the complementary data lines during read or write operations,
   connecting the control terminal of each of a pair of output series pass transistors to a separate terminal of the data latch, one of its main terminals to a separate bit line, and the second main terminal to the corresponding terminal of the other series pass transistor,
   providing a Match Output signal line that identifies a match/no-match at the end of a Search operation,
   connecting the control terminal of an output controlled switch to the common main terminal of the series pass transistors, while one of its main terminals drives the Match Output signal line to provide the result of the search operation, and
   supplying a Search Enable signal line that enables the output controlled switch only during the search operation,
   the arrangement being such that during the search operation neither of the output series pass transistors conducts if the complementary bit line data matches the data latch outputs, one of the output series pass transistors conducts maximally providing a minimal voltage drop and a low impedance charging path for the bootstrap capacitance at the enabled output controlled switch when the complementary bit line data does not match the latch data, and one of the series pass transistors conducts to discharge the bootstrap capacitance at the beginning of the precharge period of the complementary bit lines.

4. A Content Addressable Memory (CAM) cell, comprising:
   a 6T SRAM cell data latch circuit including true and false terminals; and
   a comparison circuit comprising first and second p-channel transistors connected in series at a bit match node, a first of the p-channel transistors having its gate connected to the true terminal of the data latch circuit and a second of the p-channel transistors having its gate connected to the false terminal of the data latch circuit.

5. The cell of claim 4 further including a true bit line and a false bit line, wherein the true bit line is connected to a conduction terminal of the first p-channel transistor and the false bit line is connected to a conduction terminal of the second p-channel transistor.

6. The cell of claim 5 wherein the true bit line is coupled through a first word line pass transistor to the true terminal of the data latch circuit and the false bit line is coupled through a second word line pass transistor to the false terminal of the data latch circuit.

7. The cell of claim 4 wherein the comparison circuit further includes a match line transistor having conduction terminals coupled between a match line and a reference line and a gate terminal coupled to the bit match node.

8. The cell of claim 7 wherein the reference line is a pulsed ground line.

9. The cell of claim 7 wherein the match line transistor is an n-channel transistor.

10. The cell of claim 5 wherein the true bit line is a search true bit line and the false bit line is a search false bit line.

11. A Content Addressable Memory (CAM) cell, comprising:
a data latch circuit including true and false terminals; and
a comparison circuit comprising first and second p-channel transistors connected in series at a bit match node, a first of the p-channel transistors having its gate connected to the true terminal of the data latch circuit and a second of the p-channel transistors having its gate connected to the false terminal of the data latch circuit, wherein the comparison circuit further includes a match line transistor having conduction terminals coupled between a match line and a reference line and a gate terminal coupled to the bit match node,
wherein the first and second p-channel transistors have a first Vt value and the match line transistor has a second Vt value, the second Vt value being higher than the first Vt value.

12. A Content Addressable Memory (CAM) cell, comprising:
a data latch circuit including true and false terminals;
a comparison circuit comprising first and second p-channel transistors connected in series at a bit match node, a first of the p-channel transistors having its gate connected to the true terminal of the data latch circuit and a second of the p-channel transistors having its gate connected to the false terminal of the data latch circuit;
a true bit line and a false bit line, wherein the true bit line is connected to a conduction terminal of the first p-channel transistor and the false bit line is connected to a conduction terminal of the second p-channel transistor, and wherein the true bit line is a search true bit line and the false bit line is a search false bit line; and
a read/write true bit line and a read/write false bit line and wherein the read/write true bit line is coupled through a first word line pass transistor to the true terminal of the data latch circuit and the read/write false bit line is coupled through a second word line pass transistor to the false terminal of the data latch circuit.

13. A Content Addressable Memory (CAM) cell, comprising:
a data latch circuit including true and false terminals; and
a comparison circuit comprising:
first and second transistors connected in series at a bit match node, the first transistor having its gate connected to the true terminal of the data latch circuit and the second transistor having its gate connected to the false terminal of the data latch circuit; and
a match line transistor having conduction terminals coupled between a match line and a reference line and a gate terminal coupled to the bit match node;
wherein the first and second transistors have a first Vt value and the match line transistor has a second Vt value, the second Vt value being higher than the first Vt value.

14. The cell of claim 13 wherein the data latch circuit is a 6T SRAM cell.

15. The cell of claim 13 further including a true bit line and a false bit line, wherein the true bit line is connected to a conduction terminal of the first transistor and the false bit line is connected to a conduction terminal of the second transistor.

16. The cell of claim 15 wherein the true bit line is coupled through a first word line pass transistor to the true terminal of the data latch circuit and the false bit line is coupled through a second word line pass transistor to the false terminal of the data latch circuit.

17. The cell of claim 15 wherein the true bit line is a search true bit line and the false bit line is a search false bit line.

18. The cell of claim 17 further including a read/write true bit line and a read/write false bit line and wherein the read/write true bit line is coupled through a first word line pass transistor to the true terminal of the data latch circuit and the read/write false bit line is coupled through a second word line pass transistor to the false terminal of the data latch circuit.

19. The cell of claim 13 wherein the first and second transistors are p-channel transistors and the match line transistor is an n-channel transistor.

20. The cell of claim 13 wherein the reference line is a pulsed ground line.

* * * * *